(12) United States Patent
Hirose et al.

(10) Patent No.: US 7,498,967 B2
(45) Date of Patent: Mar. 3, 2009

(54) SEMICONDUCTOR DEVICE

(75) Inventors: Masaya Hirose, Kyoto (JP); Kinya Daio, Kyoto (JP); Tetsuya Oosaka, Osaka (JP); Tomoko Nobekawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/808,623

(22) Filed: Jun. 12, 2007

(65) Prior Publication Data
US 2008/0007440 A1 Jan. 10, 2008

(30) Foreign Application Priority Data
Jul. 4, 2006 (JP) ............... 2006-184275

(51) Int. Cl.
*H03M 1/12* (2006.01)
(52) U.S. Cl. ............... 341/155; 341/118; 341/119; 341/120
(58) Field of Classification Search .......... 341/118, 341/120, 119, 155
See application file for complete search history.

(56) References Cited
U.S. PATENT DOCUMENTS

| 6,369,857 | B1 * | 4/2002 | Balaban et al. ............ 348/555 |
| 6,614,378 | B2 * | 9/2003 | Miyazaki et al. ........... 341/155 |
| 6,690,311 | B2 * | 2/2004 | Lundin et al. ............. 341/120 |
| 6,933,867 | B2 * | 8/2005 | Honda ..................... 341/118 |
| 6,967,603 | B1 * | 11/2005 | Lin ........................ 341/120 |
| 7,009,536 | B1 * | 3/2006 | Gaus, Jr. .................. 341/118 |
| 2005/0102334 | A1 | 5/2005 | Honda |

FOREIGN PATENT DOCUMENTS
JP 2005-167972 A 6/2005

* cited by examiner

*Primary Examiner*—Jean B Jeanglaude
(74) *Attorney, Agent, or Firm*—McDermott Will & Emery LLP

(57) ABSTRACT

The semiconductor device includes: an A/D conversion circuit for A/D-converting an analog input signal and outputting a resultant conversion result; and a computation circuit for performing, in synchronization with the A/D conversion circuit, computation for an updated conversion result without storing the updated conversion result every time the conversion result from the A/D conversion circuit is updated, to determine one computation result from a plurality of conversion results from the A/D conversion circuit and output the computation result.

19 Claims, 6 Drawing Sheets

SEMICONDUCTOR DEVICE

CROSS-REFERENCE TO RELATED APPLICATIONS

This application claims priority under 35 U.S.C. §119 on Patent Application No. 2006-184275 filed in Japan on Jul. 4, 2006, the entire contents of which are hereby incorporated by reference.

BACKGROUND OF THE INVENTION

The present invention relates to a semiconductor device for testing an analog to digital (A/D) conversion circuit.

In recent years, a semiconductor device called a system-on-a-chip has increasingly become the mainstream. In this type of device, an A/D conversion circuit, a digital circuit for performing processing based on the A/D conversion results and the like, for example, are placed on one chip. Some of such semiconductor devices include a mode switch circuit therein for enabling testing of only the A/D conversion circuit, among circuits in the device, so that the A/D conversion results can be directly outputted outside.

However, if the influence of noise caused by electromagnetic waves originating from a testing device (LSI tester), a substrate for testing and surrounding facilities becomes great during the testing, the A/D conversion accuracy may degrade, resulting in failure to perform appropriate testing. Moreover, recently, in response to requests for higher-performance A/D conversion circuits, a larger number of bits have been used in the A/D conversion circuits, and thus the voltage resolution required during testing has been increasingly enhanced giving smaller voltages. For this reason, noise of minute voltages that would have conventionally caused no problem has become a major cause for reducing the A/D conversion accuracy.

To address the above problem, the following technology has been proposed. That is, a data storage means is provided for storing the latest m values (m is an integer equal to or more than 3) outputted from an A/D conversion circuit. Every time a value stored in the data storage means is updated, the values in the data storage means are sorted in descending order to detect a value in a specific ordinal rank or subjected to smoothing processing for smoothing a variation, to thereby remove noise (see Japanese Laid-Open Patent Publication No. 2005-167972).

However, the noise removal technology described above has the following problems. The data storage means for storing all of the latest m values temporarily is required, and moreover processing must be made every time a value in the data storage means is updated. In particular, as the number of values stored in the data storage means is greater, the circuit scale is greater and the circuit operation speed must be higher.

SUMMARY OF THE INVENTION

An object of the present invention is minimizing the circuit scale of a circuit for testing an A/D conversion circuit.

The semiconductor device of the present invention includes: an A/D conversion circuit for A/D-converting an analog input signal and outputting a resultant conversion result; and a computation circuit for performing, in synchronization with the A/D conversion circuit, computation for an updated conversion result without storing the updated conversion result every time the conversion result from the A/D conversion circuit is updated, to determine one computation result from a plurality of conversion results from the A/D conversion circuit and output the computation result.

With the above configuration, since the conversion results from the A/D conversion circuit are not stored every time the conversion result is updated, the circuit scale can be suppressed, and yet the computation result can be obtained based on a plurality of conversion results. The circuit scale does not change so largely with increase in the number of A/D conversion results used for computation. Thus, the computation can be made based on a larger number of A/D conversion results, and this can suppress the influence of noise.

According to the present invention, a noise component affecting the A/D conversion result can be removed while the circuit scale is suppressed. It is therefore easily possible to test the A/D conversion circuit correctly.

DESCRIPTION OF THE PREFERRED EMBODIMENTS

Hereinafter, preferred embodiments of the present invention will be described with reference to the accompanying drawings.

Embodiment 1

Figure 1:
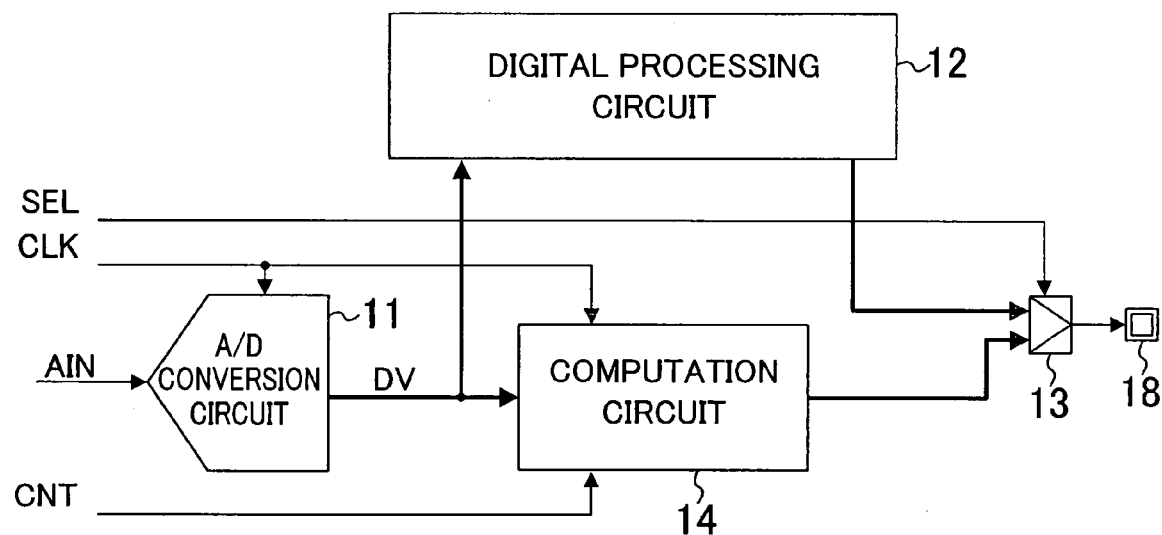
FIG. 1 is a block diagram of a semiconductor device of Embodiment 1 of the present invention.

FIG. 1 is a block diagram of a semiconductor device of Embodiment 1 of the present invention. The semiconductor device of FIG. 1 includes an A/D conversion circuit 11, a digital processing circuit 12, a selector 13 and a computation circuit 14.

The A/D conversion circuit 11 A/D-converts an analog input signal AIN every clock cycle of a clock signal CLK supplied and outputs the result (A/D conversion result) to the digital processing circuit 12 and the computation circuit 14 as a digital signal DV. The clock signal CLK, the analog input signal AIN and a computation control signal CNT may be signals received from outside the semiconductor device of FIG. 1 or internal signals.

The digital processing circuit 12, which may be a logic circuit, for example, performs predetermined processing using the A/D conversion result from the A/D conversion circuit 11, and outputs the processed result to the selector 13.

The computation circuit 14 performs computation for the A/D conversion result and outputs the computed result to the selector 13. The computation circuit 14 operates in synchronization with the A/D conversion circuit 11 according to the clock signal CLK. Resetting of a memory in the computation circuit 14 and start/stop of computation of the computation circuit 14 are controlled with the computation control signal CNT.

During normal operation, the selector 13 selects the output of the digital processing circuit 12 according to a selection signal SEL and outputs the selected one. In this case, the processed result from the digital processing circuit 12 is outputted outside the semiconductor device via an external output terminal 18.

During testing of the semiconductor device, the selector 13 selects the output of the computation circuit 14 according to the selection signal SEL and outputs the selected one. During this time, a predetermined voltage is supplied from outside the semiconductor device, for example, as the analog input signal AIN. The computation result from the computation circuit 14 is outputted outside the semiconductor device via the external output terminal 18. The conversion result can therefore be verified with a testing device (not shown) connected to this terminal. In this way, the external output terminal 18 serves as the output terminal for both normal operation and testing.

Figure 2:
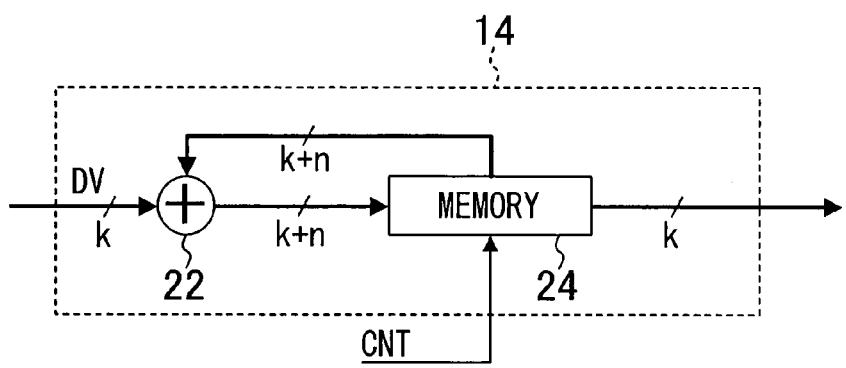
FIG. 2 is a block diagram showing an exemplary configuration of a computation circuit in FIG. 1.
Figure 3:
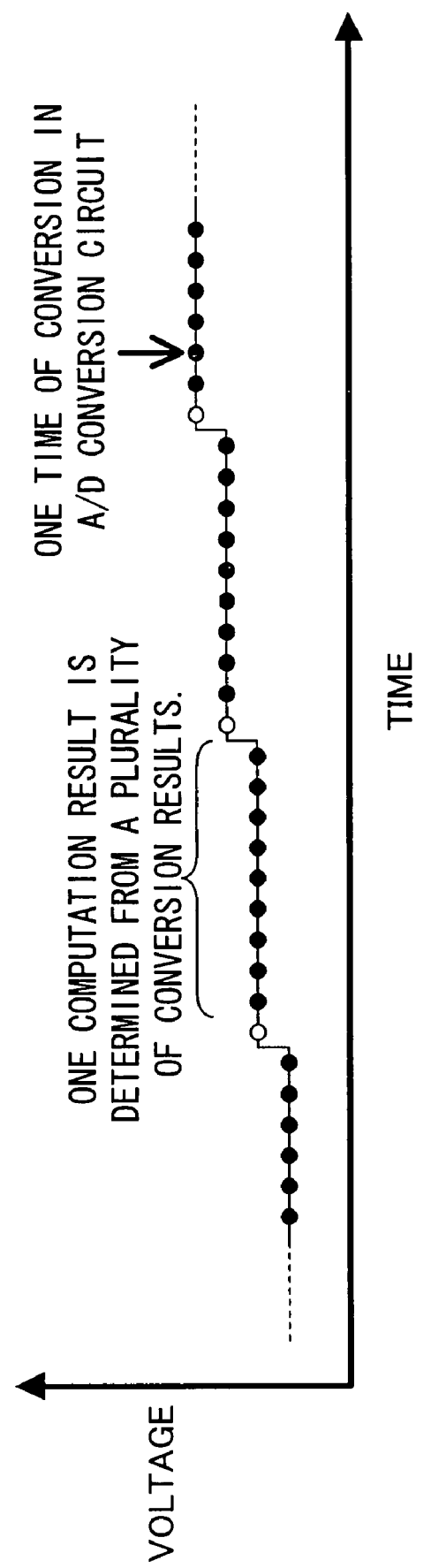
FIG. 3 is a graph showing an example of an analog input signal given to the device of FIG. 1.

FIG. 2 is a block diagram showing an exemplary configuration of the computation circuit 14 in FIG. 1. The computation circuit 14 includes an adder 22 and a memory 24. FIG. 3 is a graph showing an example of the analog input signal AIN inputted into the device of FIG. 1. As shown in FIG. 3, the voltage of the analog input signal AIN is changed in stages. In each time period during which the value of the analog input signal AIN is set constant, the computation circuit 14 determines one computation result among a plurality of A/D conversion results and outputs the determined result. Thus, one noise-removed digital output signal is obtained for one analog input signal voltage, and this further improves the accuracy of the testing of the A/D conversion accuracy.

The adder 22 in FIG. 2 adds the value of the digital signal DV to the value stored in the memory 24 every cycle of the clock signal CLK, that is, every time the A/D conversion result is updated. The added result is outputted to the memory 24 and stored therein. The memory 24 outputs the stored value to the adder 22. The memory 24 also outputs the stored value to the selector 13 every m cycles (m is an integer equal to or more than 2) according to the computation control signal CNT, and is reset. Thus, the A/D conversion result is not stored.

Assume that the digital signal DV as the A/D conversion result from the A/D conversion circuit 11 represents a value of k bits (k is a natural number). When $m=2^n$ (n is a natural number), the output of the adder 22 can be represented by (k+n) bits. Thus, (k+n) bits are enough as the capacity of the memory 24.

The memory 24 outputs the k most significant bits of the stored value to the selector 13. In other words, the memory 24 outputs the average value obtained by dividing the accumulated m A/D conversion results by $m=2^n$ as the computation result. For example, suppose the A/D conversion result from the A/D conversion circuit 11 is a value of 10 bits and the average value of 128 A/D conversion results is to be calculated. Since k=10, m=128 and n=7 in this case, the capacity required for the memory 24 is 17 bits. If 128 values are simply stored and then averaged, a memory capable of storing k×m=1280 bits will be necessary. The circuit of FIG. 2 can therefore widely reduce the circuit scale.

The circuit of FIG. 2 that averages a plurality of A/D conversion results can suppress the influence of noise. Although the substantial A/D conversion rate is 1/m with the computation result being outputted every m cycles, this normally causes no problem in testing of the A/D conversion accuracy and the like. Also, since increase in the number of A/D conversion results used for the averaging does not so much change the circuit scale, as many A/D conversion results as possible can be averaged to suppress the influence of noise.

The memory 24 may be configured to output all bits ((k+n) bits) of the value stored. In this case, the computation circuit 14 outputs the sum of m A/D conversion results as the computation result. The noise contained in the computation result is relatively smaller than that in the respective A/D conversion results, and thus a noise removal effect can be obtained.

The computation circuit 14 may further include a circuit for dividing the sum of m A/D conversion results by m.

Thus, the circuit shown in FIGS. 1 and 2 exhibits a high noise removal effect despite of its simple configuration, and can easily obtain high-accuracy A/D conversion results.

Embodiment 2

Figure 4:
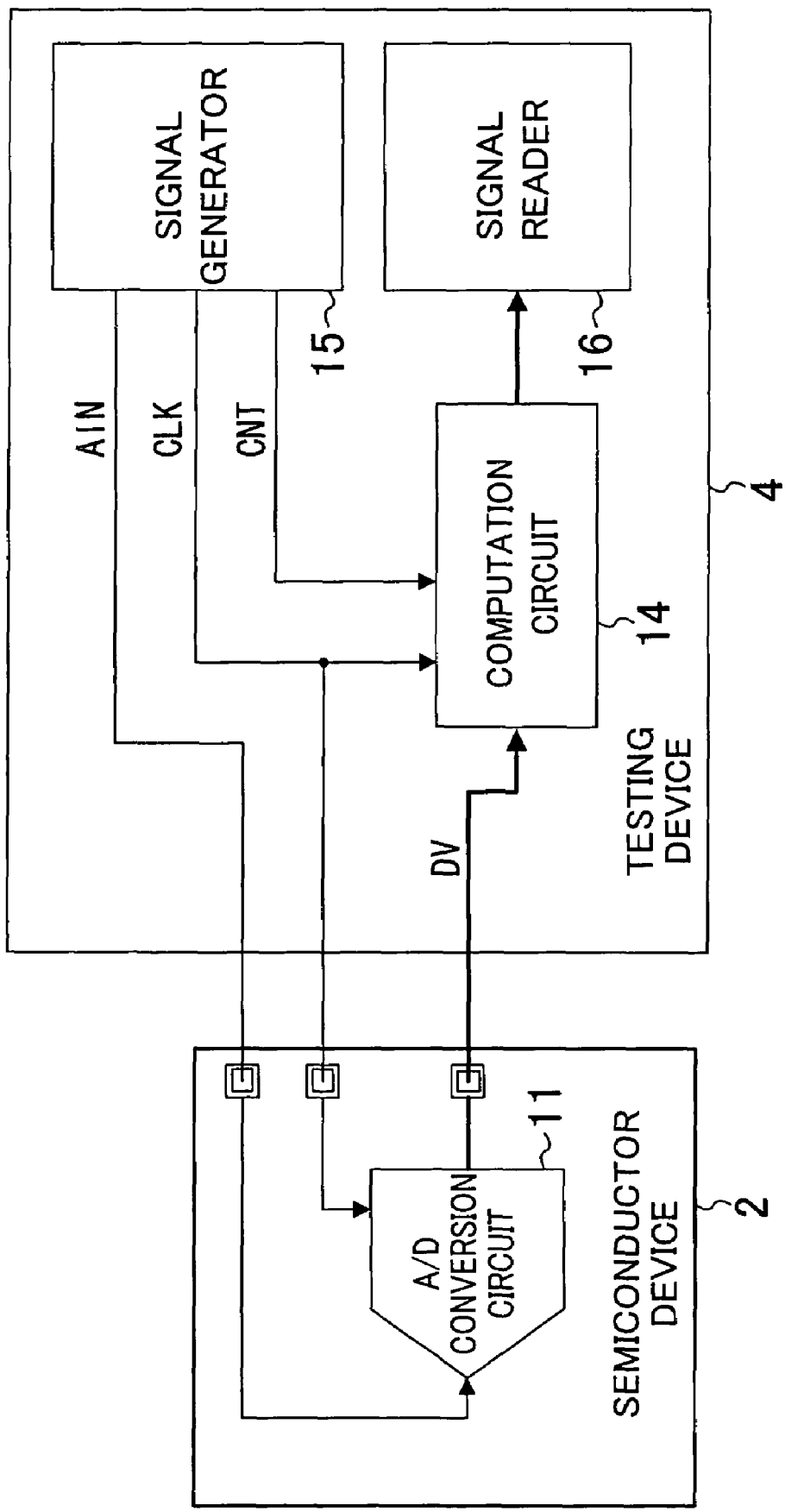
FIG. 4 is a block diagram of a testing device of Embodiment 2 of the present invention.

FIG. 4 is a block diagram of a testing device as a semiconductor device of Embodiment 2 of the present invention. A testing device 4 of FIG. 4 includes a computation circuit 14, a signal generator 15 and a signal reader 16. A semiconductor device 2 includes an A/D conversion circuit 11.

The signal generator 15 generates an analog input signal AIN and a clock signal CLK and outputs the generated signals to the A/D conversion circuit 11. The analog input signal AIN is similar to that described in Embodiment 1 and can be a signal as shown in FIG. 3, for example. The A/D conversion circuit 11 A/D-converts the analog input signal AIN every cycle of the clock signal CLK and outputs the conversion result to the computation circuit 14 as a digital signal DV.

Also, the signal generator 15 generates the clock signal CLK and a computation control signal CNT and outputs the generated signals to the computation circuit 14. The computation circuit 14 is similar to that described in Embodiment 1 and thus detailed description thereof is omitted here. The computation circuit 14 outputs the computation result to the signal reader 16. The signal reader 16 performs analysis of the computation result, including verification that the conversion result falls within a predetermined range, for example.

Alternatively, for direct testing of the value outputted from the semiconductor device 2, the testing device 4 may be provided with a circuit permitting the digital output signal DV to be directly given to the signal reader 16 bypassing the computation circuit 14.

Embodiment 3

Figure 5:
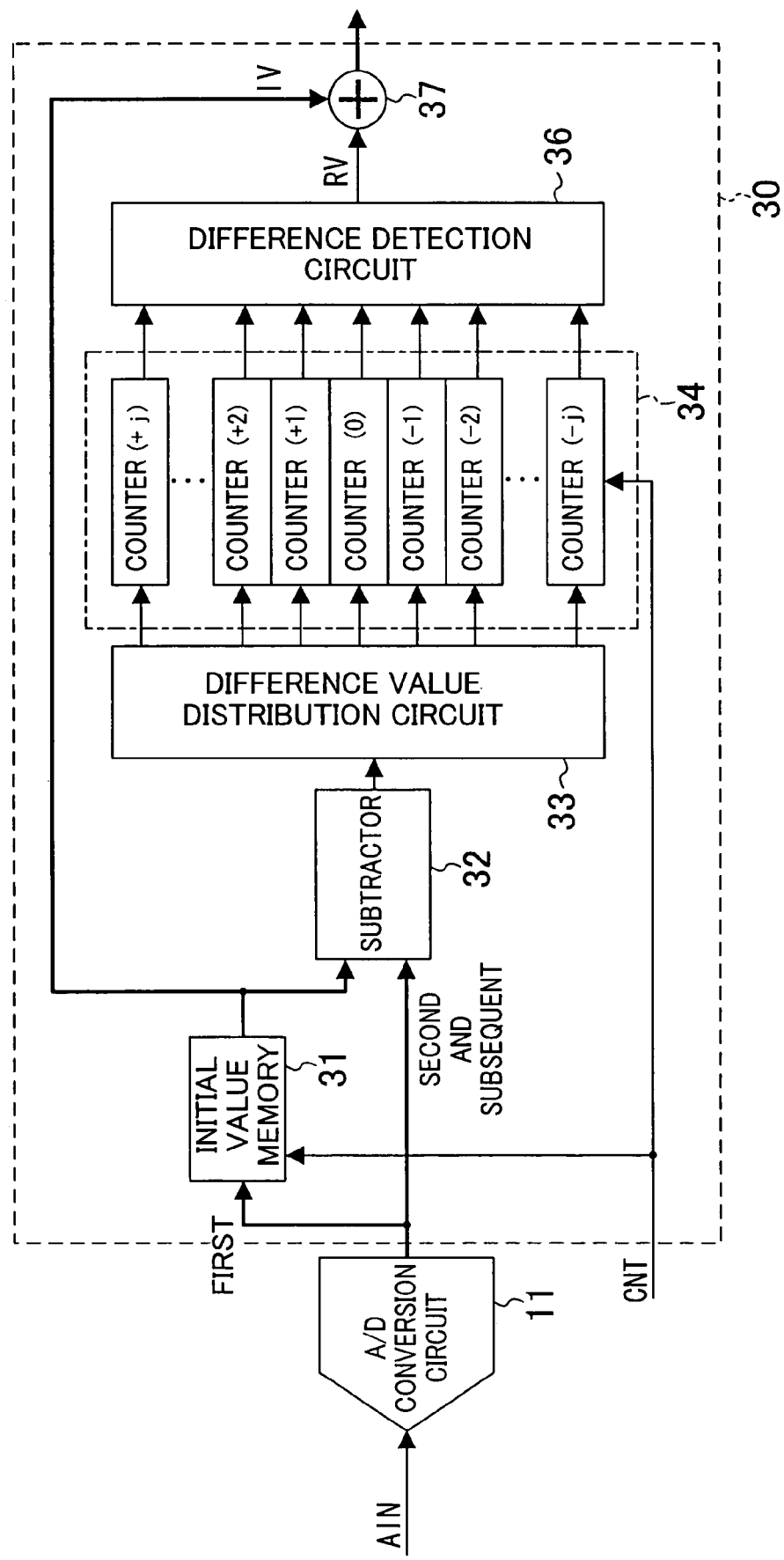
FIG. 5 is a block diagram of a semiconductor device of Embodiment 3 of the present invention.

FIG. 5 is a block diagram of a semiconductor device of Embodiment 3 of the present invention. The semiconductor device of FIG. 5 includes an A/D conversion circuit 11 and a computation circuit 30. The computation circuit 30 includes an initial value memory 31, a subtractor 32, a difference value distribution circuit 33, a counter section 34, a difference detection circuit 36 and an adder 37. The counter section 34 includes (2j+1) counters ( is an integer equal to or more than 2). These counters respectively correspond to difference values j, j−1, . . . , 2, 1, 0, −1, −2, . . . , −j that can be outputted from the subtractor 32. The initial value memory 31 and all the counters in the counter section 34 are reset with a computation control signal CNT every time A/D conversion is performed m times.

Figure 6:
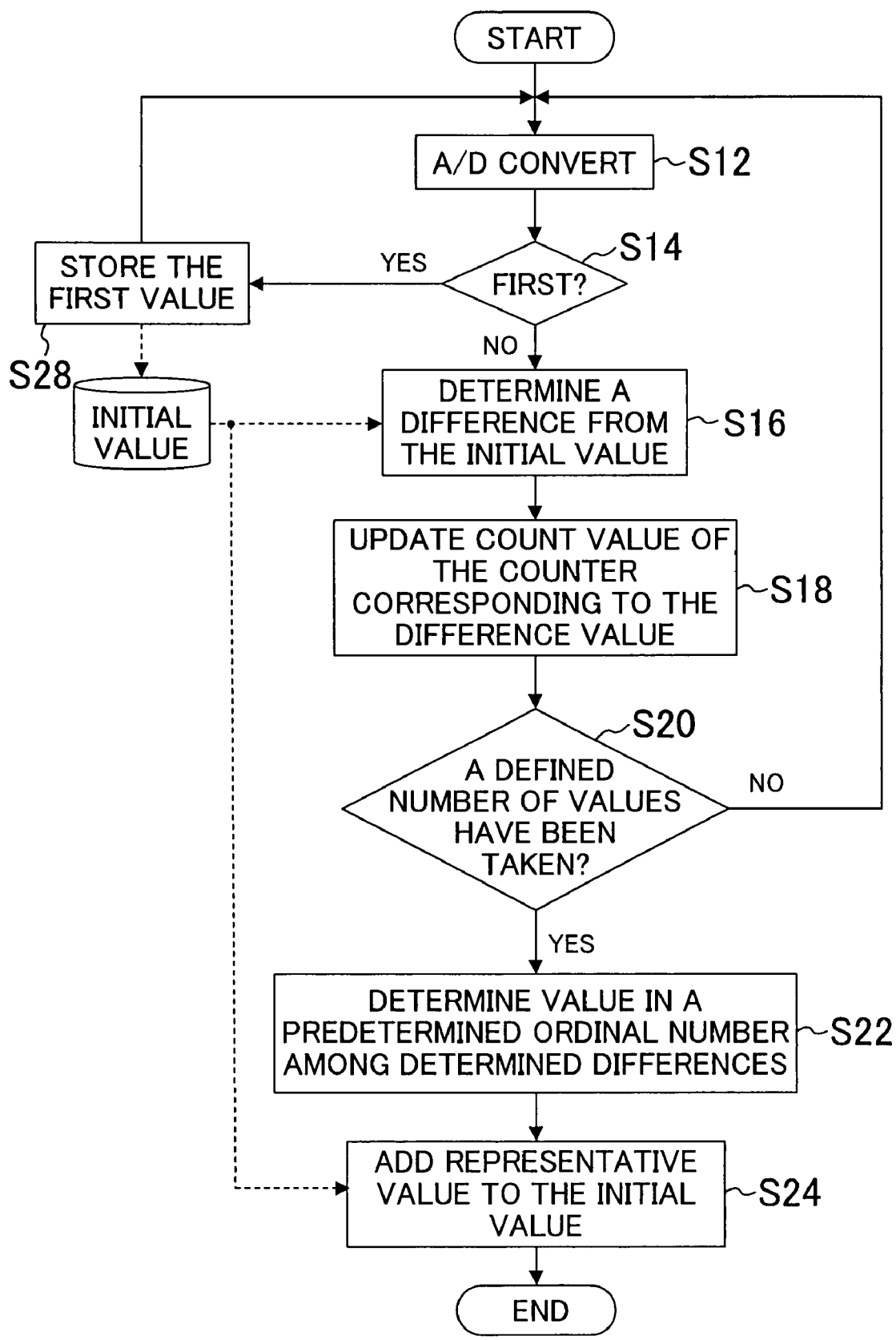
FIG. 6 is a flowchart showing a flow of processing in the semiconductor device of FIG. 5.

FIG. 6 is a flowchart showing a flow of processing in the semiconductor device of FIG. 5. Referring to FIGS. 5 and 6, the processing in the semiconductor device of this embodiment will be described. In step S12, the A/D conversion circuit 11 A/D-converts the analog input signal AIN and outputs the result to the initial value memory 31 and the subtractor 32. In step S14, whether or not the A/D conversion is the first one after reset is determined. If it is the first one, the process proceeds to step S28. Otherwise, the process proceeds to step S16.

In the step S28, the initial value memory 31 stores the first A/D conversion result therein as an initial value IV, and the process returns to the step S12. In the step S16, the subtractor 32 subtracts the initial value IV from the new A/D conversion result and outputs the resultant difference to the difference value distribution circuit 33.

In step S18, the difference value distribution circuit 33 increments the value of the counter corresponding to the received difference value by one. In step S20, whether or not a defined number of A/D conversion results have been taken into the computation circuit 30 is determined. If yes, the process proceeds to step S22. If no, the process returns to the step S12.

Figure 7:
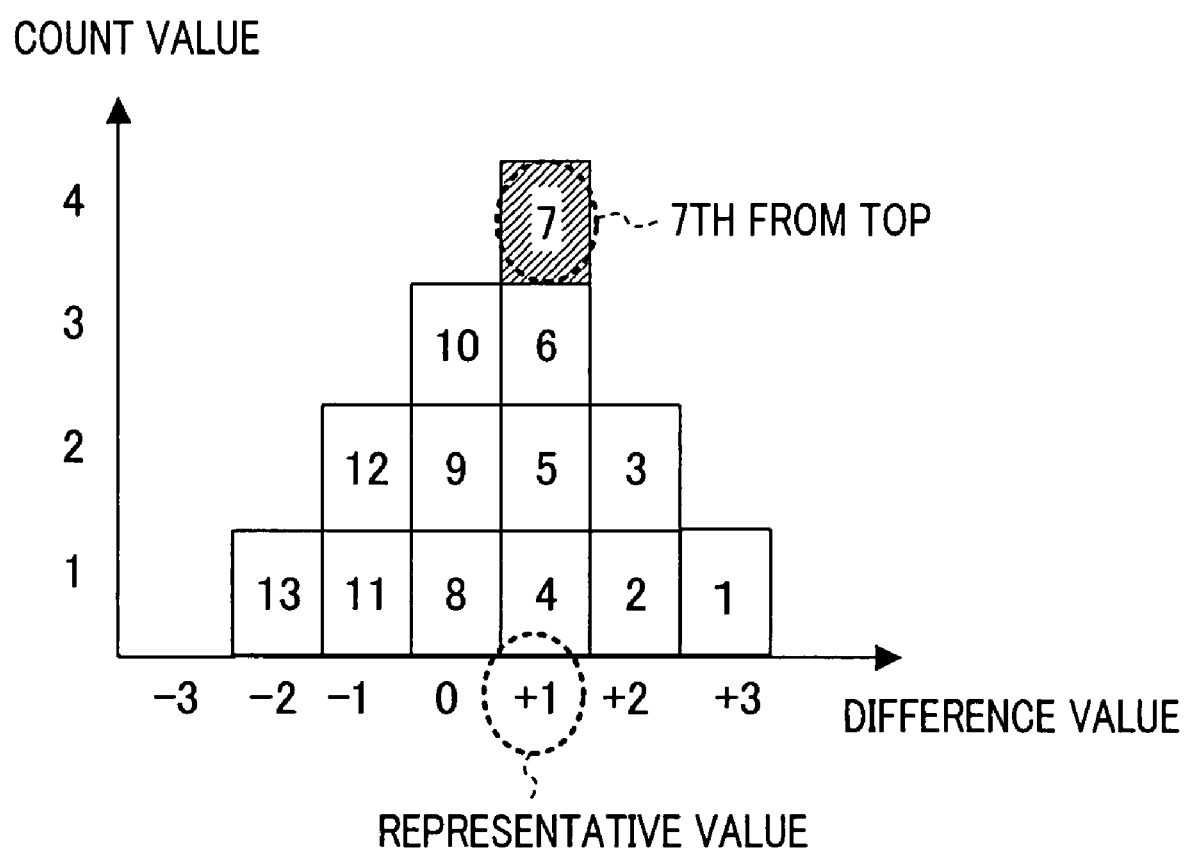
FIG. 7 is a view illustrating the count values of counters in FIG. 5.

FIG. 7 is a view illustrating the count values of the counters in FIG. 5. In FIG. 7, the frequency of each difference value is represented as the count value. The numbers (1 to 13) in FIG. 7 indicate the ordinal numbers given for the differences corresponding to the sequentially received A/D conversion results when they are sorted in descending order.

In step S22, the difference detection circuit 36 determines the value of the difference in a predetermined ordinal number, among the obtained differences, as a representative value RV, and outputs the resultant value to the adder 37. For example, the difference detection circuit 36 determines the value of the difference located in the middle among the obtained differences when they are sorted in descending order, as a representative value RV. In the case of FIG. 7, the seventh difference value from the top, "+1", is the representative value RV.

In step S24, the adder 37 adds the representative value RV to the initial value IV and outputs the result as the computation result. For example, if the initial value IV is "8", the computation result will be "9" in the case of FIG. 7. In other words, the adder 37 outputs the conversion result located in the middle among 13 conversion results excluding the first one, when they are sorted in descending order, as the computation result.

The computation circuit 30 in FIG. 5 is provided with counters of the number covering the range of the difference values. The circuit scale of the computation circuit 30 depends on the capacity (number of counters) of the counter section 34. In this embodiment, this capacity can be set at a minimum necessary and optimum capacity.

For example, assuming that the A/D conversion result from the A/D conversion circuit 11 is of 10 (=k) bits and one A/D conversion result from 128 values is determined as the computation result, for example, the greatest count value of each counter is 128=$2^7$. The capacity required for each counter is therefore 7 (=n). If the range of the difference values is from −16 to +16 (j=16), the number of counters in the counter section 34 is 33. The capacity of the counter section 34 is therefore n×(2j+1)=7×33=231 bits.

Additionally, a capacity of 10 bits is necessary for the initial value memory. If 128 values are simply stored and then one A/D conversion result is determined in a similar manner, a memory capable of storing k×m=1280 bits will be necessary. The circuit of FIG. 5 can therefore widely reduce the circuit scale.

As described above, in the computation circuit 30 of FIG. 5, while the substantial A/D conversion rate is 1/m with the conversion result being outputted every m cycles, the circuit scale of the computation circuit can be widely suppressed.

Alternatively, in the case of FIG. 7, for example, the computation circuit 30 may be configured to select one among the differences other than the first and thirteenth differences from the top in a predetermined manner and determine the sum of the selected difference and the initial value IV as the computation result.

Also, in the testing device 4 of FIG. 4, the computation circuit 30 in FIG. 5 may be provided in place of the computation circuit 14.

As described above, the present invention can provide a highly accurate value as the A/D conversion result while suppressing the circuit scale, and thus is useful as a semiconductor device for testing an A/D conversion circuit and the like.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A semiconductor device comprising:
   an A/D conversion circuit for A/D-converting an analog input signal and outputting a resultant conversion result; and
   a computation circuit for performing, in synchronization with the A/D conversion circuit, computation for an updated conversion result without storing the updated conversion result every time the conversion result from the A/D conversion circuit is updated, to determine one computation result from a plurality of conversion results from the A/D conversion circuit and output the computation result.

2. The semiconductor device of claim 1, wherein the computation circuit determines the computation result from a plurality of conversion results outputted from the A/D conversion circuit when the voltage of the analog input signal is constant.

3. The semiconductor device of claim 1, further comprising:
   a digital processing circuit for performing predetermined processing using the conversion result from the A/D conversion circuit and outputting the processing result; and
   a selector for selecting an output of the digital processing circuit or an output of the computation circuit and outputting the selected one.

4. The semiconductor device of claim 1, wherein the computation circuit determines an average value of a plurality of conversion results from the A/D conversion circuit as the computation result.

5. The semiconductor device of claim 4, wherein the computation circuit determines a sum of the n-th (n is a natural number) power of 2 conversion results from the A/D conversion circuit and outputs a portion of the summed result other than the n least significant bit or bits as the computation result.

6. The semiconductor device of claim 1, wherein the computation circuit determines a sum of a plurality of conversion results from the A/D conversion circuit as the computation result.

7. The semiconductor device of claim 1, wherein the computation circuit determines any of a plurality of conversion results from the A/D conversion circuit as the computation result.

8. The semiconductor device of claim 7, wherein the computation circuit determines any of conversion results, among a plurality of conversion results from the A/D conversion circuit, other than one conversion result whose value is maximum and one conversion result whose value is minimum, as the computation result.

9. The semiconductor device of claim 7, wherein the computation circuit determines a conversion result located in the middle among a plurality of conversion results from the A/D conversion circuit when they are sorted in descending order, as the computation result.

10. The semiconductor device of claim 7, wherein the computation circuit comprises:
an initial value memory for storing a first conversion result from the A/D conversion circuit;
a subtractor for determining a difference of a second or subsequent conversion result from the value in the initial value memory;
a counter section having a counter corresponding to every value the difference can take on;
a difference value distribution circuit for incrementing the value of a counter corresponding to the value of a difference determined by the subtractor every time the subtractor determines a difference;
a difference detection circuit for determining the value of a difference located in the middle among differences determined from the second and subsequent conversion results from the A/D conversion circuit when they are sorted in descending order, based on the values of the counters; and
an adder for adding the value determined by the difference detection circuit to the value in the initial value memory and outputting the added result.

11. A semiconductor device comprising:
a signal generator for generating an analog input signal and outputting the generated signal;
a computation circuit for performing, in synchronization with an A/D conversion circuit for A/D-converting the analog input signal and outputting the converted signal, computation for an updated conversion result without storing the updated conversion result every time the conversion result from the A/D conversion circuit is updated, to determine one computation result from a plurality of conversion results from the A/D conversion circuit and output the computation result; and
a signal reader for analyzing the computation result.

12. The semiconductor device of claim 11, wherein the signal generator generates an analog input signal having a constant voltage, and
the computation circuit determines the computation result from a plurality of conversion results outputted from the A/D conversion circuit when the voltage of the analog input signal is constant.

13. The semiconductor device of claim 11, wherein the computation circuit determines an average value of a plurality of conversion results from the A/D conversion circuit as the computation result.

14. The semiconductor device of claim 13, wherein the computation circuit determines a sum of the n-th (n is a natural number) power of 2 conversion results from the A/D conversion circuit and outputs a portion of the summed result other than the n least significant bit or bits as the computation result.

15. The semiconductor device of claim 11, wherein the computation circuit determines a sum of a plurality of conversion results from the A/D conversion circuit as the computation result.

16. The semiconductor device of claim 11, wherein the computation circuit determines any of a plurality of conversion results from the A/D conversion circuit as the computation result.

17. The semiconductor device of claim 16, wherein the computation circuit determines any of conversion results, among a plurality of conversion results from the A/D conversion circuit, other than one conversion result whose value is maximum and one conversion result whose value is minimum, as the computation result.

18. The semiconductor device of claim 16, wherein the computation circuit determines a conversion result located in the middle among a plurality of conversion results from the A/D conversion circuit when they are sorted in descending order, as the computation result.

19. The semiconductor device of claim 16, wherein the computation circuit comprises:
an initial value memory for storing a first conversion result from the A/D conversion circuit;
a subtractor for determining a difference of a second or subsequent conversion result from the value in the initial value memory;
a counter section having a counter corresponding to every value the difference can take on;
a difference value distribution circuit for incrementing the value of a counter corresponding to the value of a difference determined by the subtractor every time the subtractor determines a difference;
a difference detection circuit for determining the value of a difference located in the middle among differences determined from the second and subsequent conversion results from the A/D conversion circuit when they are sorted in descending order, based on the values of the counters; and
an adder for adding the value determined by the difference detection circuit to the value in the initial value memory and outputting the added result.

* * * * *